(12) United States Patent
Vaculik et al.

(10) Patent No.: US 11,108,324 B1
(45) Date of Patent: Aug. 31, 2021

(54) CONTROLLER-BASED VARIABLE DUTY CYCLE PULSE WIDTH MODULATION

(71) Applicant: NXP B.V., Eindhoven (NL)

(72) Inventors: Lukas Vaculik, Valasske Mezirici (CZ); Ivan Sieklik, Martin (SK); Stanislav Arendárik, Banská Bystrica (SK)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/831,311

(22) Filed: Mar. 26, 2020

(51) Int. Cl.
| | |
|---|---|
| *H02M 3/157* | (2006.01) |
| *H02P 7/29* | (2016.01) |
| *H03K 7/08* | (2006.01) |
| *H02M 1/00* | (2006.01) |

(52) U.S. Cl.
CPC .............. *H02M 3/157* (2013.01); *H02P 7/29* (2013.01); *H03K 7/08* (2013.01); *H02M 1/0009* (2021.05); *H02M 1/0012* (2021.05)

(58) Field of Classification Search
CPC . H02M 3/157; H02M 2001/0012; H03K 7/08
See application file for complete search history.

(56) References Cited

U.S. PATENT DOCUMENTS

| | | | | |
|---|---|---|---|---|
| 2009/0292936 | A1* | 11/2009 | Hayakawa | ............... G06F 1/025 713/330 |
| 2013/0015798 | A1* | 1/2013 | Wright | ..................... H03K 7/08 318/400.25 |
| 2013/0147552 | A1 | 6/2013 | Hsu et al. | |
| 2014/0207979 | A1 | 7/2014 | Wu | |
| 2017/0077712 | A1* | 3/2017 | Sugisawa | ................ H02M 1/44 |
| 2019/0103771 | A1 | 4/2019 | Piasecki et al. | |

OTHER PUBLICATIONS

Freescale/NXP USA, Inc.; "1000W Class-D Audio Amplifier Using Kinetis Quick Start Guide"; 8 pages (Nov. 18, 2015).
OctoWS2811 Technical Details, PJRC Electronic Projects Components Available Worldwide, 12 pgs., retrieved from the internet Oct. 20, 2020 at: https://www.pjrc.com/teensy/td_libs_OctoWS2811.html#tech.
U.S. Appl. No. 17/075,621; not yet published; 36 pages, filed (Oct. 20, 2020).

* cited by examiner

*Primary Examiner* — Alex Torres-Rivera

(57) ABSTRACT

Embodiments of a method and device are disclosed. In an embodiment a controller is disclosed. In an embodiment, the controller includes a pulse width modulation (PWM) module configured to generate a sequence of pulses each having a width that is modulated by a PWM value stored in a register of the PWM module, a memory having a table of PWM values configured to be written into the PWM module register, a direct memory access (DMA) module coupled to the PWM module and to the memory table and configured to write a PWM value from the memory table into the PWM register in response to a DMA trigger, and a core coupled to the DMA module and configured to write the PWM values into the memory table.

20 Claims, 9 Drawing Sheets

CONTROLLER-BASED VARIABLE DUTY CYCLE PULSE WIDTH MODULATION

BACKGROUND

Pulse width modulation (PWM) signals are used as inputs to control a power converter. A PWM signal has a sequence of pulses, usually with a consistent amplitude and a fixed frequency. The width of each pulse is modulated to vary the duty cycle or on time of the pulse. When this modulated digital output is applied to a power converter an analog waveform is produced. Power converter outputs have been used to power electric motors, charge batteries, drive illumination sources and for many other types of loads. The power converter and its connected power source can be designed to suit the demands of different loads while the PWM signal serves only as a low power digital control input. When the PWM signal has a higher duty cycle, then the power converter produces a higher power output. By increasing or decreasing the widths of the pulses, the resulting power amplitude can be increased or decreased to suit different loads.

SUMMARY

Embodiments of a method and device are disclosed. In an embodiment a controller is disclosed. In an embodiment, the controller includes a pulse width modulation (PWM) module configured to generate a sequence of pulses each having a width that is modulated by a PWM value stored in a register of the PWM module, a memory having a table of PWM values configured to be written into the PWM module register, a direct memory access (DMA) module coupled to the PWM module and to the memory table and configured to write a PWM value from the memory table into the PWM register in response to a DMA trigger, and a core coupled to the DMA module and configured to write the PWM values into the memory table.

In an embodiment, the PWM module is configured to send the DMA trigger to the DMA module after generating each pulse.

In an embodiment, the memory table has a sequentially ordered plurality of PWM values, and wherein the DMA module is configured to write the PWM values from the memory table into the PWM register in the sequential order in response to each DMA trigger.

In an embodiment, the DMA module is configured to write the first PWM value in the sequence after writing the last PWM value in the sequence.

In an embodiment, the PWM module is configured to generate at least two different sequences of pulses to drive two inputs of a power converter, the PWM module having a first register for the first of the at least two sequences and a second register for the second of the at least two sequences, wherein the DMA module has a first channel for the first register and a second channel for the second register, and wherein the DMA module is configured to write from the first channel to the first register in response to a first channel trigger from the PWM module and to write from the second channel to the second register in response to the first channel trigger from the PWM module.

In an embodiment, the controller includes an input signal interface coupled to the core configured to receive an input signal and wherein the core is configured to modify the PWM values of the table of PWM values in response to the input signal and to write the modified PWM values into the memory.

In an embodiment, the core is configured to modify the PWM values by selecting a stored set of different PWM values in response to the input signal.

In an embodiment, the core is configured to modify the PWM values by incrementing and decrementing the PWM values in response to the input signal.

In an embodiment, the input signal is a closed feedback loop from a power output of a power converter.

In an embodiment, the input signal is a power output command from an external component.

In an embodiment, a method for generating variable duty cycle pulse width modulation (PWM) pulses is disclosed. The method includes writing PWM values from a processing core of a controller into a table of PWM values in a memory of the controller, generating a sequence of pulses at a PWM module of the controller, each pulse having a width that is modulated by a PWM value stored in a PWM register of the PWM module, sending a DMA trigger from the PWM module to a direct memory access (DMA) module of the controller after generating each pulse, and writing a PWM value by the DMA module from the memory table into the PWM register in response to each DMA trigger.

In an embodiment, the memory table has a sequentially ordered plurality of PWM values in a sequence, and wherein writing a PWM value comprises writing each PWM value from the table into the PWM register in the sequential order in response to each DMA trigger.

In an embodiment, writing a PWM value includes writing the first PWM value in the sequence after writing the last PWM value in the sequence.

In an embodiment, the method also includes generating at least one additional sequence of pulses by the PWM module, the PWM module having a first register for the first of the at least two sequences and a second register for the second of the at least two sequences, wherein the DMA module has a first channel for the first register and a second channel for the second register, and wherein writing PWM values comprises writing from the first channel to the first register in response to a first channel trigger from the PWM module and writing from the second channel to the second register in response to a second channel trigger from the PWM module.

In an embodiment the method also includes an input signal interface coupled to the processing core configured to receive an input signal, the method further comprising modifying the PWM values of the table of PWM values in response to the input signal and writing the modified PWM values into the memory.

In an embodiment, modifying the PWM value comprises selecting a stored set of different PWM values in response to the input signal.

In an embodiment, the method also includes applying the sequence of pulses to drive a power converter to produce a power output.

In an embodiment, a charging system includes a resonant circuit configured to apply a resonant field to charge a power storage device, a power converter configured to receive a direct current power and a sequence of pulses and produce an alternating power output to drive the resonant circuit, a pulse width modulation (PWM) module configured to generate the sequence of pulses each having a width that is modulated by a PWM value stored in a register of the PWM module, a memory having a table of PWM values configured to be written into the PWM module register, a direct memory access (DMA) module configured to write a PWM value from the memory into the PWM register in response to a DMA trigger from the PWM module, and a processing core configured to write the PWM values into the memory.

In an embodiment, the charging system also includes an input signal interface coupled to the processing core configured to receive an input signal via a closed feedback loop from a power output of the power converter and wherein the processing core is configured to modify the PWM values of the memory table in response to the input signal and to write the modified PWM values into the memory table.

In an embodiment, the power converter has at least two inputs to receive two different sequences of pulses, wherein the PWM module is configured to generate the at least two different sequences of pulses to drive the two inputs of the power converter, the PWM module having a first register for the first sequence and a second register for the second sequence, wherein the DMA module has a first channel for the first register and a second channel for the second register, and wherein the DMA module is configured to write from the first channel to the first register in response to a first channel trigger from the PWM module and to write from the second channel to the second register in response to a second channel trigger from the PWM module.

DETAILED DESCRIPTION

It will be readily understood that the components of the embodiments as generally described herein and illustrated in the appended Figs. could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
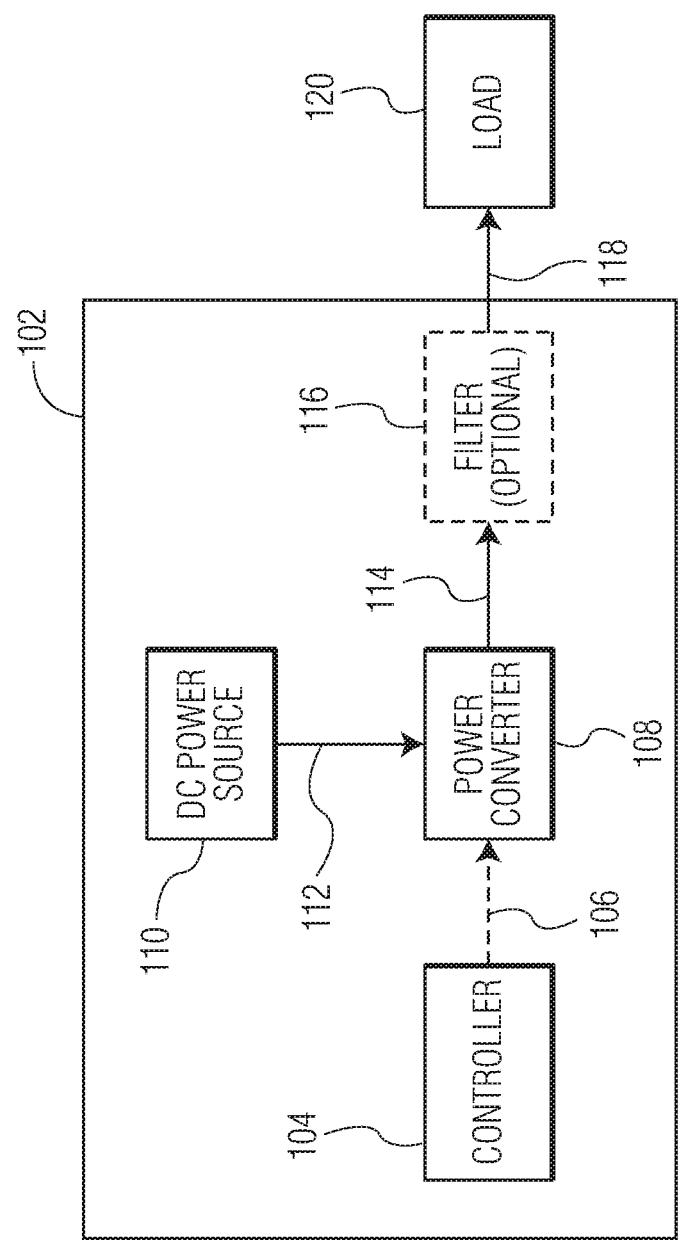
FIG. 1 depicts an example of a power generation system and a load.

FIG. 1 depicts an example of a power generation system 102 and a load 120. The power generation system provides power to drive the load 120. The power generation system includes a controller 104 coupled to a power converter 108. The power converter 108 is coupled to a DC (Direct Current) power source 110 and to the load 120. The controller 104 sends a pulse width modulation (PWM) digital signal 106 to the power converter 108 to control a power output 114 of the power converter 108. The DC power source 110 provides power 112 to the power converter 108. The power converter applies the PWM signal 106 from the controller 104 to the received power 112 to generate a modulated analog power output 114. In some embodiments, the power output is an AC (Alternating Current) waveform and is applied to the load 120 though an optional filter 116 to smooth the analog power output. The resulting filtered power 118 from the power generation system 102 is applied to drive the load 120.

The power source 110 and the power converter 108 may be designed for any particular load including inductive battery chargers, electric motors of any kind, audio voice coils, illumination systems, digital circuitry and electronic components, and power distribution systems. Because the digital PWM signal is used only as a control input, it may be applied to multiple power converters simultaneously and the signal may be inverted to feed multiple inputs of a single power converter.

The power converter 108 may take different forms depending on the nature of the load 120, such as a Class-D converter, push-pull converter, half-bridge converter, full-bridge converter or another form. The PWM signal output 106 of the controller 104 is configured to provide an output suited to the particular type of converter.

Figure 2:
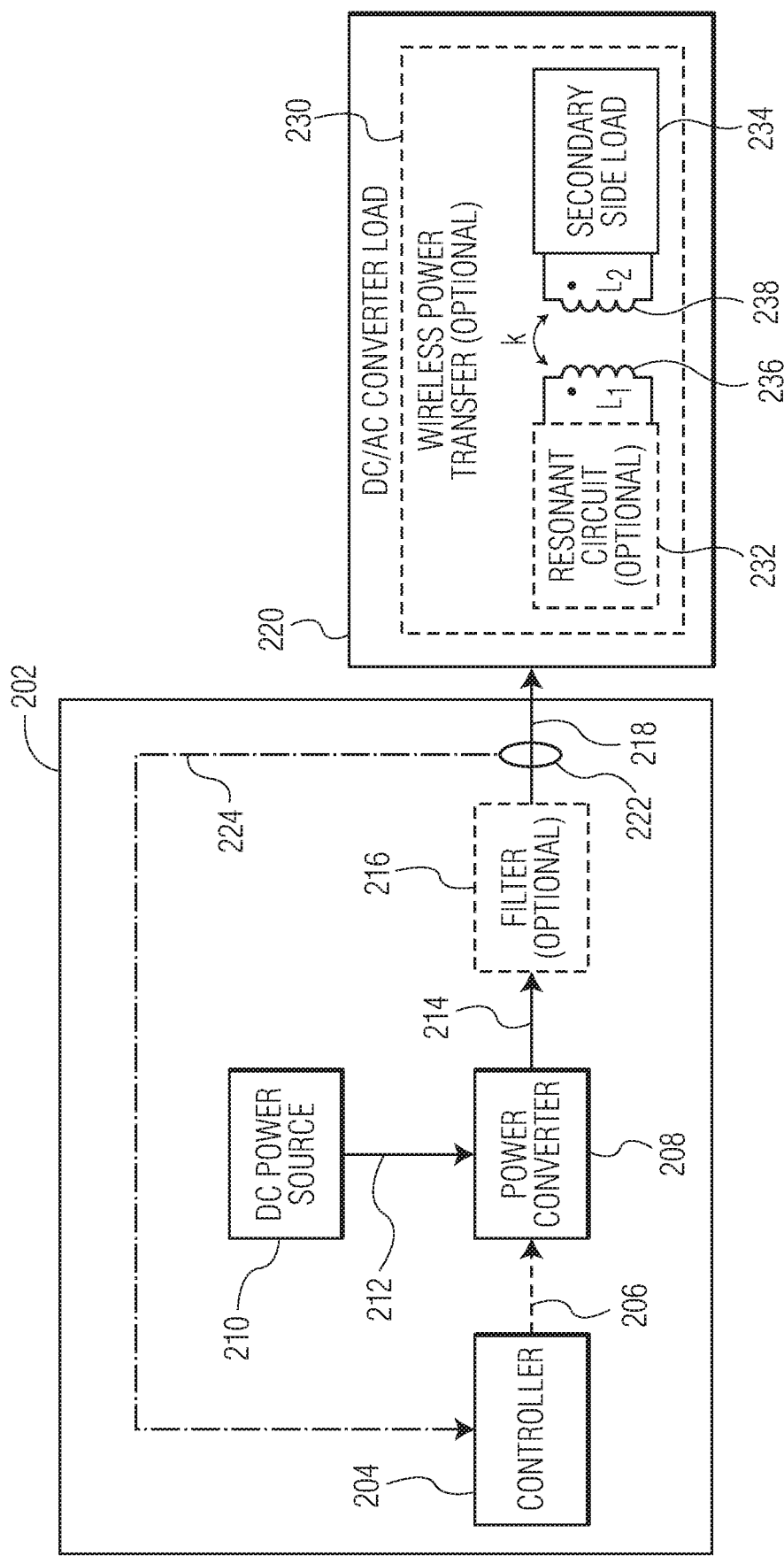
FIG. 2 depicts an alternative example of a power generation system and a load for wireless charging.

FIG. 2 depicts another example of a power generation system 202 and a load that is configured for wireless charging. In some embodiments, a DC/AC converter load 220 includes a wireless power transfer system 230, with an optional resonant circuit 232 coupled through a primary coil 236 to a secondary side load 234 coupled to the resonant circuit 232 primary coil through a secondary coil 238. The resonant circuit drives the power through the coils matching the characteristics of the load. In some embodiments, the secondary side load 234 represents a battery and the resonant circuit represents a wireless charging pad or plate. Such a configuration is suitable for charging small batteries for wireless communications devices, larger batteries for tools, and still larger batteries for vehicles. Any of a variety of different charging scenarios may be accommodated, by appropriate modification of the power supply 210 and the power converter 214.

In this example, a controller 204 is connected to a power converter 208 to provide a PWM signal 206 to the power converter 208. The power converter 208 is configured to drive the resonant circuit and may produce an AC output such as a full or half-bridge power converter that generates a power output 214 by modulating input power 212 from a connected DC power source 210. A modulated AC power output 214 from the power converter may optionally be processed through a filter 216 to generate the final filtered AC power supply 218 to the load 220.

In some embodiments, a sensor 222, such as an inductive loop current sensor is electrically coupled to the filtered AC power supply output 218. An output 224 from the sensor is provided to the controller 204 to allow the controller to adjust the PWM signal 206 in response to the sensed current. The sensor output 224, in this case a closed loop feedback signal, may be used to regulate the form of the PWM signal. In some embodiments, a battery load will present varying amounts of resistance as the battery charges. By measuring the current through the sensor, the controller may be configured to reduce the supplied current as the battery becomes more fully charged. This may be done by decrementing the PWM values in a stored set of PWM values as the resistance increases. Similarly, the core may increment the PWM values if the resistance decreases. By incrementing and decrementing the PWM values, an appropriate power is supplied to the AC/DC converter load 220.

In other embodiments, the controller 204 is connected to different or additional sensor inputs or to external components (not shown) such as an actuator, or some other control device and is programmed to determine an appropriate PWM signal based on that input. In some embodiments, the controller 104 receives an input sensor signal from the load 120 that is applied by the controller to regulate the duty cycle of the PWM signal 114. In some embodiments, the controller receives a command or control signal from an external component to determine the nature of the power output that is to be generated. In some embodiments, the command is an ON or OFF signal and the controller provides a constant output PWM signal. The command may optionally further indicate a particular power output level to be applied. The power 214 applied to the load may be constant or varied as determined by the PWM signal 206 from the controller 204. In some embodiments, the controller includes a host (not shown), which may include, for example, a software application that is stored in memory of the controller and executed by processing circuits of the controller. The controller may be of a type known in the field, but uniquely configured for the described implementations. The controller may be implemented as, for example, digital signal processors (DSPs), digital signal controllers (DSCs) and/or central processing units (CPUs).

Figure 3A:
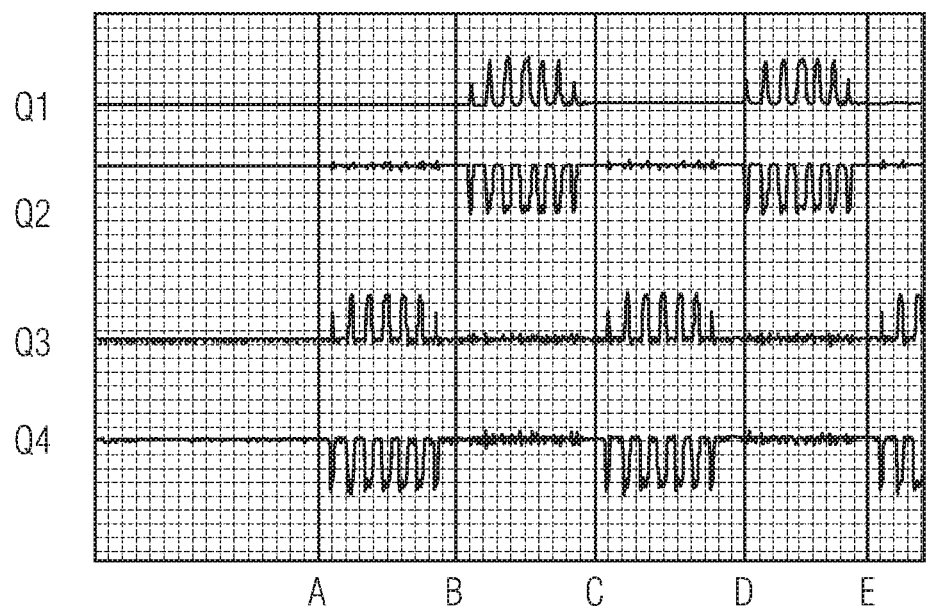
FIG. 3A illustrates an example PWM sequence generated by a controller.
Figure 3B:
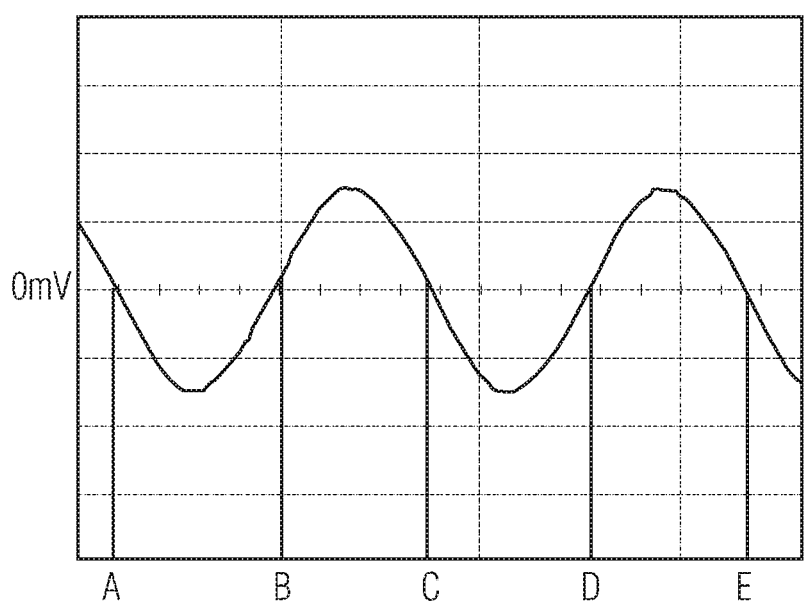
FIG. 3B illustrates an example of a filtered power signal generated by a power converter module using the sequence of FIG. 3A.
Figure 4:
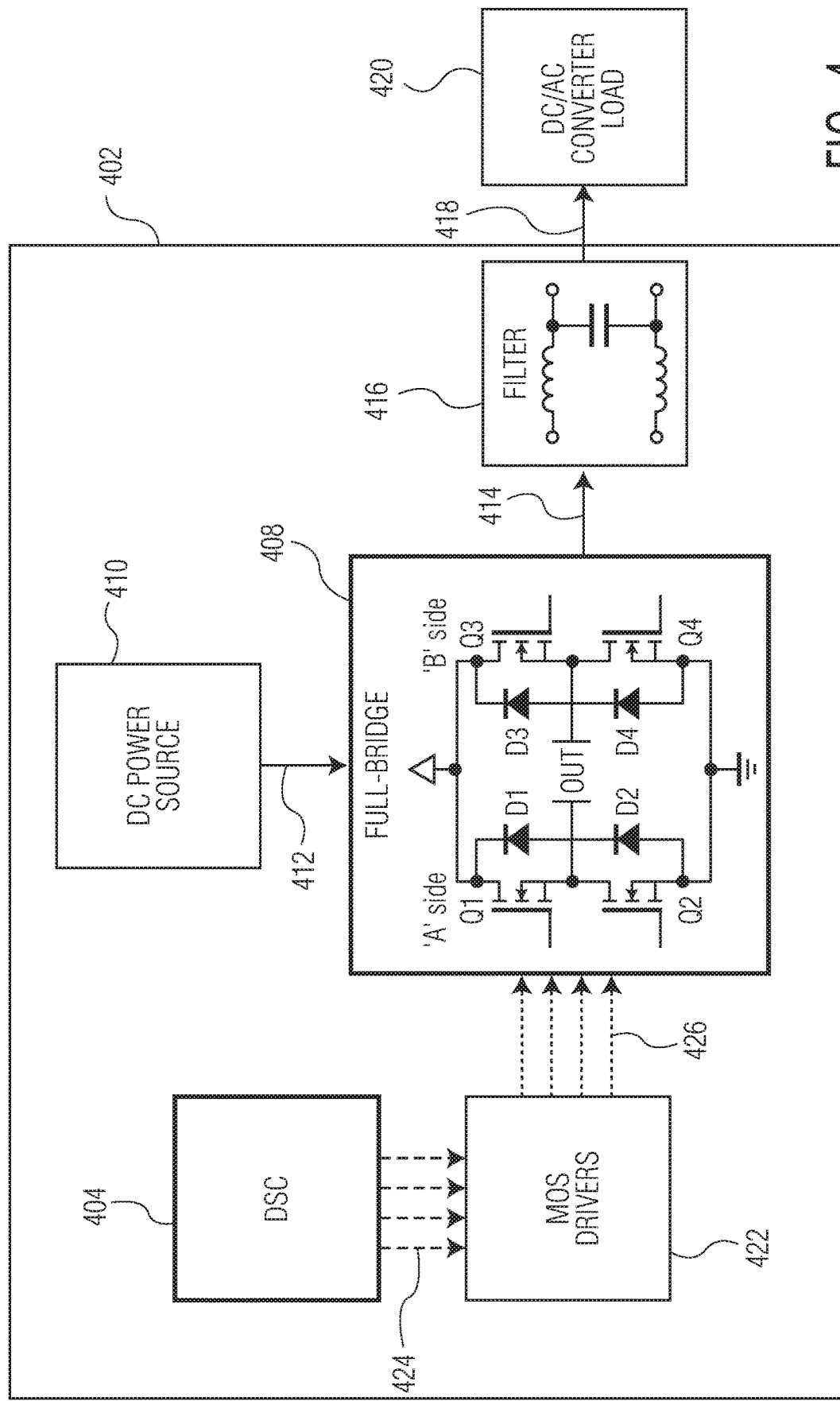
FIG. 4 depicts a further alternative example of a power generations system and a load.

FIG. 3A illustrates a PWM sequence that may be generated by a controller as described herein and suitable for a full-bridge or other type of four-input power converter. For this purpose, the controller generates four outputs designated as Q1, Q2, Q3, and Q4 in accordance with the four respective inputs of a full bridge power converter as shown in FIG. 4. Q2 is the inverse polarity of Q1 and Q4 is the inverse polarity of Q3, but otherwise identical. Accordingly, only two unique PWM waveforms are generated. FIG. 3B illustrates an idealized filtered sine wave waveform that is produced after the four inputs are applied to the power converter and filtered. As shown, there are zero crossings of the sine wave at times A, B, C, D and E on the horizontal time axis of FIG. 3B. These zero crossings align with the transitions between the inputs in FIG. 3A.

Considering the waveform between time A and time B, this negative half cycle of the sine wave is generated in response to the pulses Q3 and Q4 of FIG. 3A. As shown, there are 7 pulses between A and B in both Q3 and Q4. The initial and final pulses are narrower and the central or fourth pulse is wider with the intermediate pulses increasing or decreasing in width between the ends and the center. The initial and final pulses are so narrow, that due to the PWM module's electrical structure, the output PWM voltage is not able to reach the full height before the end of the pulse. The modulated width of these seven pulses results in the voltage curve of FIG. 3B. Similarly, the same modulation applied to terminals Q1 and Q2 between B and C results in the opposite voltage curve of FIG. 3B. By varying the timing and width of the pulses, the amplitude and frequency of the sine wave of FIG. 3B may be varied to suit different loads. A sine wave output is shown here as particularly suitable for the wireless power transfer of FIG. 2, but further varying the timing and width of the pulses can result in completely different waveforms, when appropriate.

FIG. 4 depicts an alternative implementation of a power generation system 402 and a load 420. In this embodiment, a DSC (Digital Signal Controller) is configured to generate four PWM signals 424, such as the Q1, Q2, Q3, and Q4 signals of FIG. 3A. The PWM signals are applied to MOSFET (Metal Oxide Semiconductor Field Effect Transistor) based drivers 422 that are coupled to the DSC. The internal circuitry of the controller is primarily optimized for minimum power and minimum current in order to reduce the power consumption of the digital circuitry. The MOS drivers 422 may be configured as a line stage or a power amplifier to generate a stable high current signal 426 to a connected power converter 408. There may be an external current supply (not shown) connected to the MOS drivers to supply the current.

The power converter receives DC power 412 from a connected source 410 and applies the PWM drive signals 426 to the four inputs of a full bridge power converter 408 to produce a rough sine wave or other output power signal 414. This signal is filtered in an inductive-capacitive power filter 416 or any other type of filter between the power converter 408 and a load 420 to provide a filtered power output 418 to the load 420. The DSC may vary the PWM according to any particular internal programming or external command or sensor input or a combination of these types of control inputs.

Figure 5:
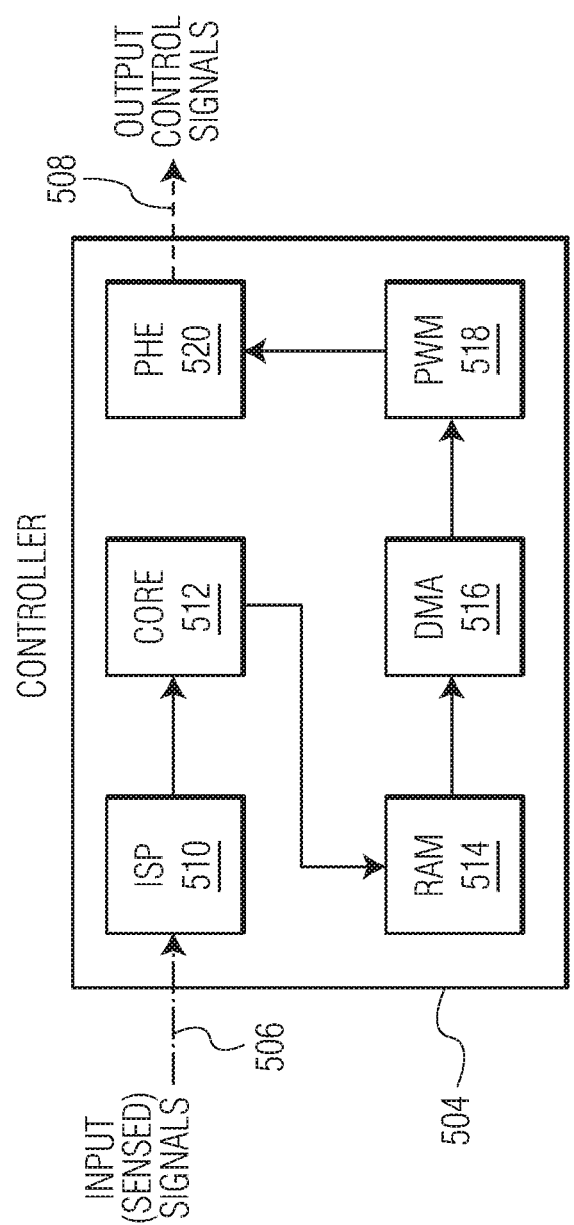
FIG. 5 depicts an example of components within a controller for generating a PWM pulse sequence.

FIG. 5 depicts an example of components within the controller for generating the PWM signals described herein. The controller 504 includes an input signal processing (ISP) module 510 connected to an input port of the controller. A core is coupled to the ISP on one side and to a memory 514 on the other side. The core may be a processing core, a controller core, a DSP core or any other type of core. The memory is coupled to a DMA (Direct Memory Access) module 516. The DMA module is coupled to a PWM module 518 and the PWM module is coupled to a peripheral interface (PHE) 520. In this and the other figures there may be more connections than are shown in the diagrams. For example, the controller may be coupled to the DMA and PWM modules for a variety of different purposes. In addition, the controller may have many more components that are not shown in order to simplify the drawing figure.

The controller 504 receives an input 506 at the ISP module 510 of the controller. The ISP module 510 is an input signal interface that performs signal conversion, regulation, bus protocols and any other necessary functions, on any input signal received at the interface. The function depends on the nature of the input signal 506. In some embodiments, the ISP 510 provides input signal conversion using an analog to digital converter and comparator or a sample and hold circuit. The ISP 510 may receive multiple input signals of different types depending on the implementation including closed loop feedback regulation. The sensor or command input from the ISP 510 is provided to the processing core 512 which analyzes the inputs and determines a PWM signal to be generated. While the pulses of the PWM signal may be generated at any suitable rate from one to millions of Hz, the pulses are generated by the DMA module 516, PWM module 518 and PHE 520. These blocks operate independently of the core so that pulses are generated continuously without any processing core 512 invention until a change in the output waveform is required. After the pulse generation process is started, the processing core 512 of the controller 504 may perform many other functions in between performing the PWM generation functions mentioned herein.

The processing core 512 selects a PWM sequence based on the ISP input and applies the selection to the RAM (Random Access Memory) module or memory module 514 to select a set of values corresponding to the selected PWM sequence. In some embodiments, the RAM 514 stores the PWM values in the form of tables as in an array of registers, for example a sequentially ordered set of PWM values. While the memory 514 is being referred to as RAM it may take any suitable form including flash, SRAM (Static Random Access Memory), magnetic memory, or any other suitable type. The core 512 is responsible for processing the input sensor data and for managing and maintaining the tables of PWM values that are stored in the RAM 514. In some embodiments, the core 512 maintains multiple tables of different PWM values to produce different PWM signals in response to the input signal 506. In some embodiments, the core 512 modifies the PWM values stored in a table in the RAM 514 based on the sensor input signal 506. In other words, the core generates new or modified PWM values and writes these new or modified PWM values into registers in a table of the RAM. When the sensor input signal 506 indicates to the core 512 that there is no change to the PWM values, then the core 512 does not necessarily interact with the RAM 514 so that the operations continue unchanged. As mentioned above, the input signal 506 may be measurement from a sensor 506 or a command from an external component (not shown).

The stored PWM values are read from the tables of the RAM 514 by the DMA module 516 which controls the provision of the selected values to the PWM module 518 independent of the core 512. The DMA module 516 allows the PWM module 518 direct access to the PWM values stored in the appropriate table in the RAM 514. The PWM module generates the PWM pulse sequence as selected by the processing core 512 using the values read from the RAM 514 and written into the PWM module 518 by the DMA module 516. The pulse sequence generated by the PWM module is provided to the peripheral driver module 520 which feeds the output PWM sequence 508 with appropriate electrical characteristics, to drivers or to the power converter depending on the particular implementation. The DMA module 516 may be incorporated into the processing core or another component of the controller. The DMA module 516 attends to the communication between the RAM 514 and the PWM module 518 allowing the processing core to attend to other tasks.

Figure 6:
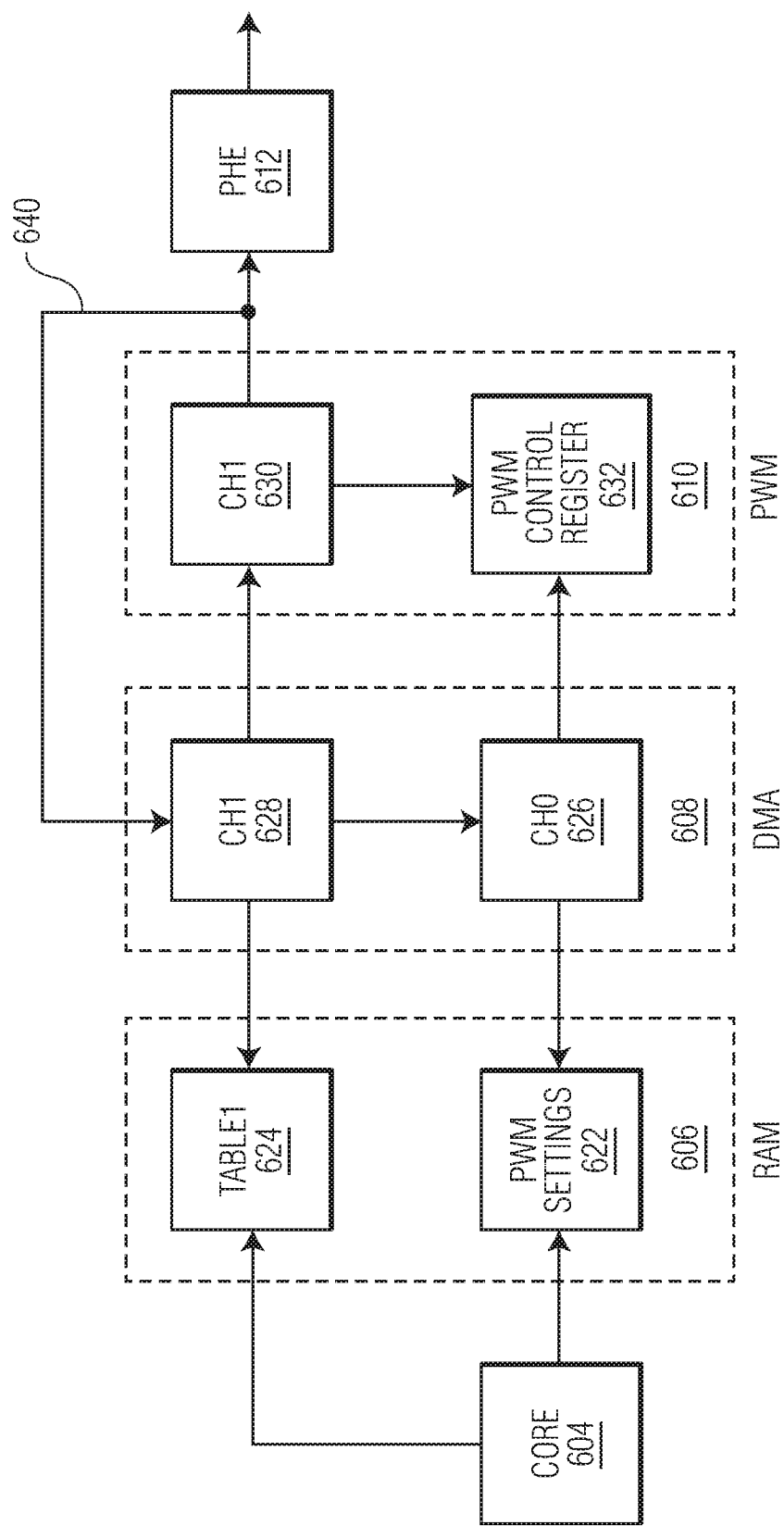
FIG. 6 illustrates components and operations in a controller to generate a PWM pulse sequence.

FIG. 6 illustrates components and operations in a controller to generate a PWM sequence. A processing core 604 is coupled to a memory 606 that has a memory table 624, labeled Table 1, for PWM values and a second table 622, labeled as PWM settings, with settings for the PWM module. The first table 624 has multiple registers in sequential order, each representing a particular timing and duration for a pulse. In some embodiments, the table is pre-configured. In some embodiments there are multiple stored tables each with a different set of PWM sequences. The core can select a particular stored set of PWM values in response to different input signals. In some embodiments, the core 604 generates, sets, and modifies the values in one or more tables to suit particular PWM sequences. As mentioned above, the register values may be set, modified, and selected based on input signals (not shown) from sensors or commands. The core 604 also may control and modify the PWM settings table 622 of the memory 606.

The memory 606 is coupled to a DMA module 608 with multiple channels 626, 628 to transfer data from the memory 606 to other components. In the illustrated example, the channels are labeled as CH0 and CH1. The DMA module is coupled to registers of the PWM module 610 that generates the PWM sequence as described above. The PWM module has control registers 632 coupled to CH0 626 of the DMA module 608 and a pulse generation register 630 coupled to CH1 620 of the DMA module 608. The output of the PWM module 610 goes to the connected PHE 612 module, which may be an I/O interface, and from there to external components, such as a power converter.

In operation, data stored in the memory table 624 contains multiple duty cycle values for output CH1 630 of the PWM module 610. The DMA module's CH1 628 provides direct memory access from the PWM module 610 to the Table 1 values without any action by the core 604. For the DMA module 608, each CH1 access will be made with a source address to read the addressed register in the memory's Table 1. The DMA module uses a destination address to the PWM CH1 register 630 to write the value.

In an embodiment, to generate the pulse sequence after the DMA CH1 is enabled, the DMA module 608 transfers a first Table 1 configuration value through CH1 to the PWM. After this transfer is complete, the DMA module enables CH0 and transfers the PWM setting to the PWM module control register 610, by accessing the PWM settings 622 and writing the settings into the PWM 610. With the PWM module 610 configured, the DMA module transfers another PWM value through CH1 after each PWM CH1 period. This period may be determined based on a PWM control register or in another way. This timing period may serve as a trigger to transfer the next CH1 value from the memory to the PWM CH1 register. Alternatively, the PWM module 610 generates a trigger 640 to the DMA module after each pulse is generated. In response to this trigger, the DMA module CH1 628 accesses Table 1 of the memory to fetch another PWM value to store in the PWM CH1 register.

The process of refreshing the PWM CH1 value after each pulse continues from the initial to the final PWM value for the selected table. After the last value in the table has been provided to the PWM module, then the DMA module reloads the table in CH1 628 and loops back to the initial value. In this way, Table 1 624 in the memory 606 can be used to define a cycle of a particular waveform, such as the sine wave of FIG. 3B from time A to time B and the same PWM values may be used over again for each succeeding cycle. To generate a different waveform, the core 604 may modify the values in the memory table 624 or provide a different table for use by the DMA module. In some embodiments, the core modifies the stored set of PCM values in one or more of the tables by incrementing or decrementing the stored set of values. The core can do so in response to an input signal or some other input or parameter. In another embodiment, the DMA module loads a full cycle of PWM values into the PWM module and the PWM module cycles through the values from first to last and then loops back to repeat the cycle until the core determines that the waveform is to be changed.

Figure 7:
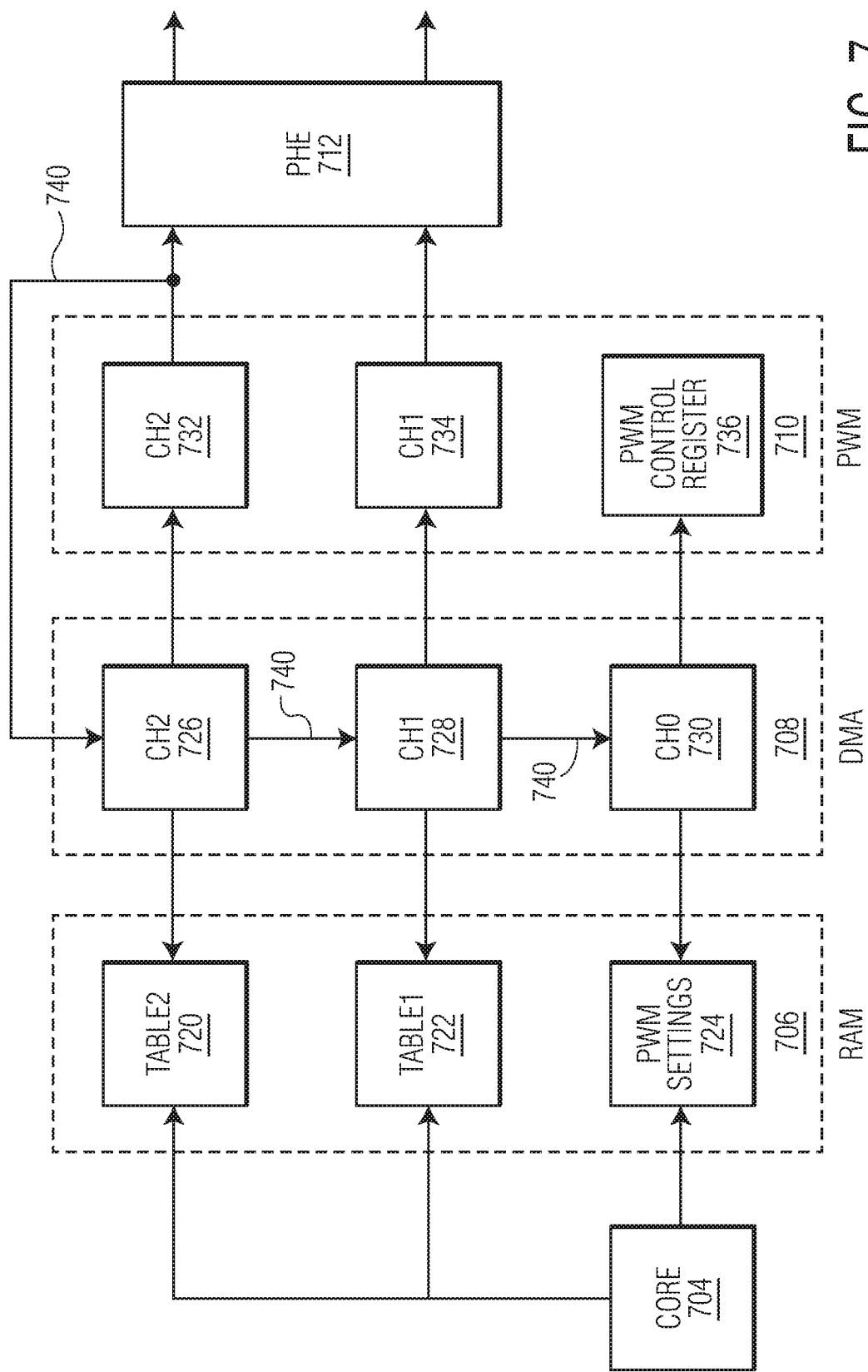
FIG. 7 illustrates components and operations in a controller to generate multiple PWM pulse sequences.

The configuration of FIG. 6 is well-suited for application to a single input power converter such as a single channel DC/AC converter. The configuration may be modified by adding more channels to suit a much larger number of inputs to drive a more complex power converter or to drive multiple different power converters from different PWM output sequences. FIG. 7 illustrates a three-channel variable duty cycle PWM system. The system may be expanded to have many more channels. In addition, additional sets of memory, DMA modules and PWM modules may be added to a controller to provide more PWM sequences and be controlled by the same or additional cores.

In FIG. 7, a core 704 is coupled to a memory 706 with multiple tables 720, 722, 724 of PWM and setting values. The memory 706 is coupled to a DMA module 708 with multiple memory channels CH2 726, CH1 728, CH0 730 each having access to one or more of the memory tables using addresses. The DMA module 708 is coupled to multiple registers CH2 732, CH1 734, and control 736 of a PWM module 710. The PWM produces pulse sequences that are provided to a coupled peripheral interface PHE 712 for output to a power converter. The power converter may be, for example, a two-input power converter such as a multichannel DC/AC converter.

In operation, the core 704 controls the values set in each of the tables 720, 722, 724. The DMA module 708 enables a channel 726, 728, 730 for each register that is to be supported by the PWM module 710. The number of channels and the corresponding registers may vary to support different configurations of the PWM module. These configurations may be preset, configured in the field, or modified to suit different applications and changes in use. The DMA module 710 receives an initialization or data request from the PWM module and then writes the PWM values into the register on each channel. In this example, when the CH2 and CH1 registers 732, 734 are initialized with the initial value of the respective table 720, 722, the PWM module will generate a first pulse to the I/O module 712. The pulse provides a feedback DMA trigger signal 740 to one of the channels 726 of the DMA module 708. This causes the DMA module 708 to refresh the registers 732, 734 of both channels. The two channels are synchronized to provide two inputs to the same power converter and the same trigger may be used for both channels.

In some embodiments, the DMA trigger signal 740 from the PWM output is applied to one of the DMA channels 726 so that the DMA channel writes the next PWM value from the respective table 720 into the respective PWM channel 732. The same DMA trigger 740 reaches all of the DMA channels 728, 730 through the DMA module so that all of the PWM channels are updated at the same time. In another embodiment, one PWM channel triggers each DMA channel directly. In another embodiment, each PWM channel triggers its own DMA channel. In some embodiments, the DMA channels trigger each other. As an example, the first DMA trigger may come from the PWM CH0. Then DMA CH0 triggers DMA CH0 which triggers DMA CH1 which again triggers DMA CH1 and so forth.

In many applications, at least two sequences are needed to drive a single power converter. However, in many cases, only one memory channel is required to generate the two sequences. For example, a half-bridge power converter typically requires one PWM signal input and a second complementary PWM signal input. The two pulse sequences can be generated by directly generating the first pulse sequence using a PWM module in one channel and then the second PWM sequence can be generated as a complementary signal from the first sequence. Only one table and one memory channel are needed. A full bridge power converter as described above in the context of FIGS. 3A and 3B requires two unique sequences and two complementary sequences. This can be generated using two tables and two memory channels. In some embodiments the Q3 input is a time delayed version of the Q1 input. The Q3 input can be generated using the same table and channel but switching the output interface. A three-phase converter requires three tables and memory channels plus the three complementary signals. This provides the six inputs. The configuration of the tables and channels may be configured for other power converters and for more than one power converter.

Figure 8:
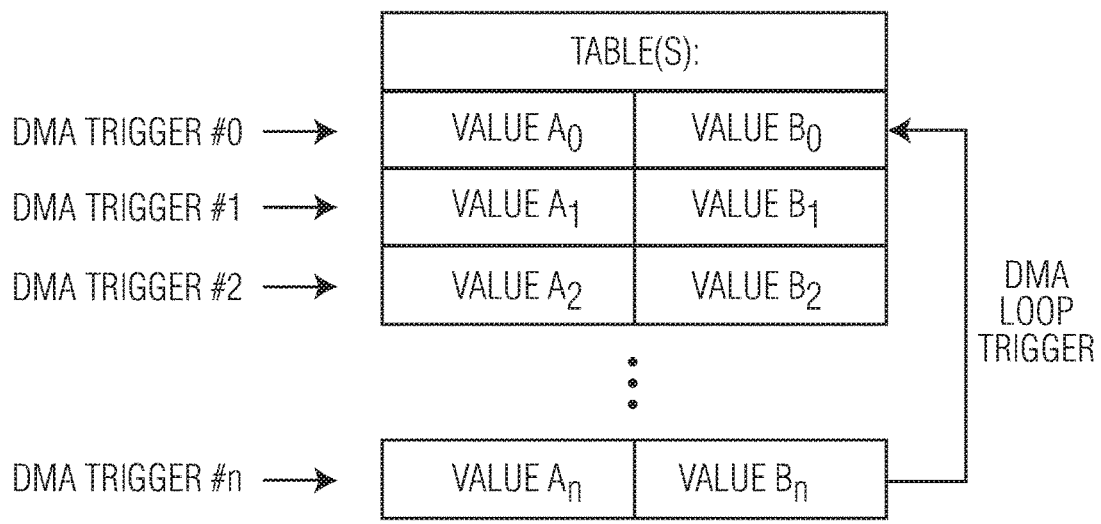
FIG. 8 illustrates an example of a table of PWM values.

FIG. 8 illustrates a table of PWM values in memory such as might be used in the embodiments described above. The table has a column of A values $A_0, A_1, A_2 \ldots A_n$ and a column of B values $B_0, B_1, B_2 \ldots B_n$. The values in each row are aligned and each row is in a sequential order. The PWM values are accessed in the sequential order in response to a trigger from the PWM module to the DWM module to access a row. As an example, in response to the first trigger DMA Trigger #0, the DMA module reads PWM values $A_0$ and $B_0$ from the table and writes the two PWM values into the PWM register for a particular channel. In response to the second trigger, DMA Trigger #1, the DMA module reads the next PWM values in the sequence, $A_1$, and $B_1$, from the table and writes these values into the same PWM register. In response to the third trigger, DMA Trigger #2, the DMA module reads the next PWM values in the sequence, $A_2$, and $B_2$, from the table and writes these values into the same PWM register. This continues through all n rows of the table so that in response to the $n^{th}$ trigger, DMA Trigger #n, the DMA module reads the $n^{th}$ PWM values in the sequence, $A_n$, and $B_n$, from the table and writes these values into the same PWM register. After reading all n values in order and reaching the end of the table, a DMA loop trigger is received at the DMA module and the DMA module goes back from the last row in the sequence, row n, to the first row in the sequence, row 0. The DMA module reads the first row from the table to write into the PWM register. The DMA loop trigger may be an internal DMA signal generated by the DMA module or it may be generated by the PWM.

Figure 9:
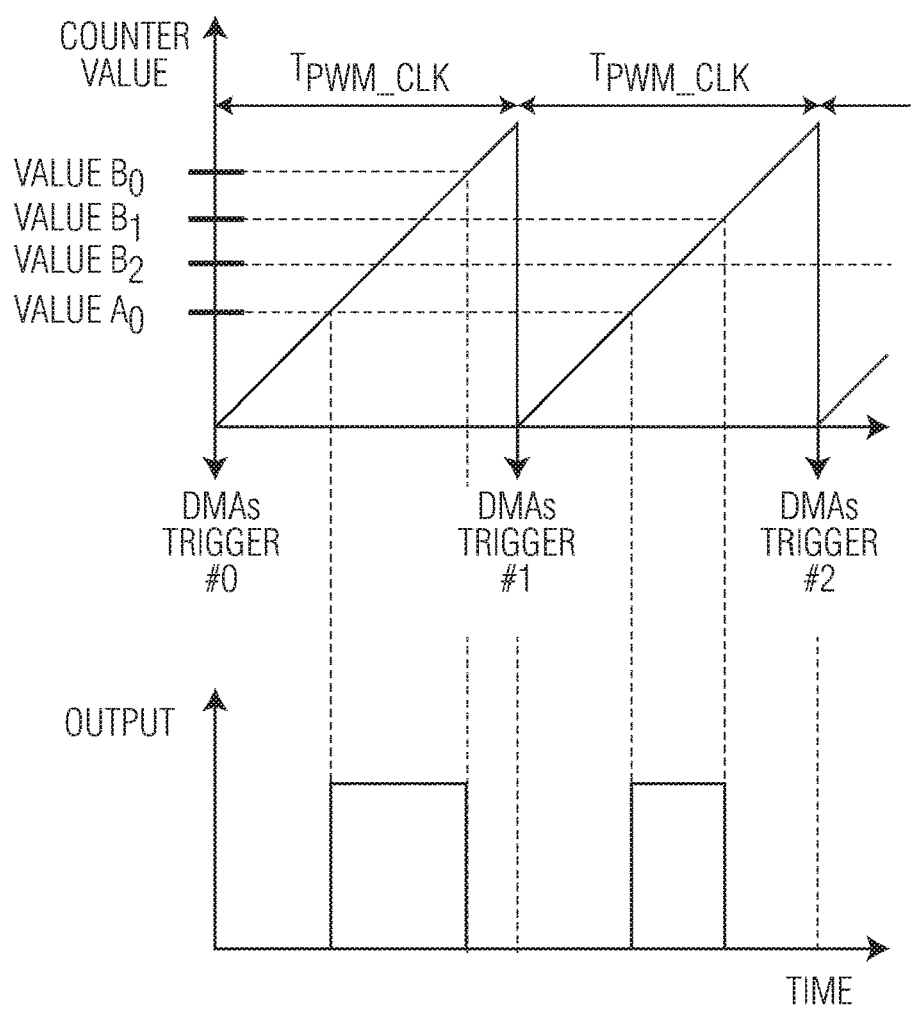
FIG. 9 illustrates defining pulse widths using the table of FIG. 8.

FIG. 9 illustrates an example of how the values provided by the DMA module may be used to define variable width pulses in the PWM. The top and bottom graphs are aligned on the same time scale with time on the horizontal axis and different triggers aligned on the vertical axis for clarity. In this example, $A_0$ represents a single value that is used as the start time for each pulse. $A_0$ is a time distance on the horizontal scale from the trigger time to the start of the pulse. The B values represent the pulse width. The width of the first pulse is determined by $B_0$ which represents a time duration from the start of the pulse at time $A_0$ or the trigger time to the end of the first pulse. The next value $B_1$ determines the width of the second pulse, which is shown as being narrower because the value $B_1$ is less than $B_0$ so that the time duration of the second pulse is less. The triggers are aligned to a clock rate or cycle time for the pulses that is indicated as $T_{PWM\_CLK}$. This clock rate may be modified by the controller or the PWM module to suit different purposes.

By modifying only the B values, the PWM module may be made to generate different waveforms such as sine waves, triangle waves, sawtooth waves, etc. By modifying both the A and B values a larger range of different pulse widths may be defined at the cost of more complexity. The duty cycle of the pulses may be used to control the amplitude of these waveforms. The accuracy of the PWM values may be determined at least in part by the number of bits for the A and B values. Even with 16-bit values, the system has very fine control over the output power from the power converter.

The controller configuration and topology using DMA and PWM modules allow the controller to generate variable duty cycle PWM signals for many different applications, such as motor controllers, switching power supplies, photovoltaic systems, and even test waveforms. With a single controller, the signal generator is low complexity and allows the controller core to run other applications while also controlling the PWM output signal. Using the high frequency capability of the topology, power converters with high operating frequencies and high power may be driven such as wireless power transmitters.

Figure 10:
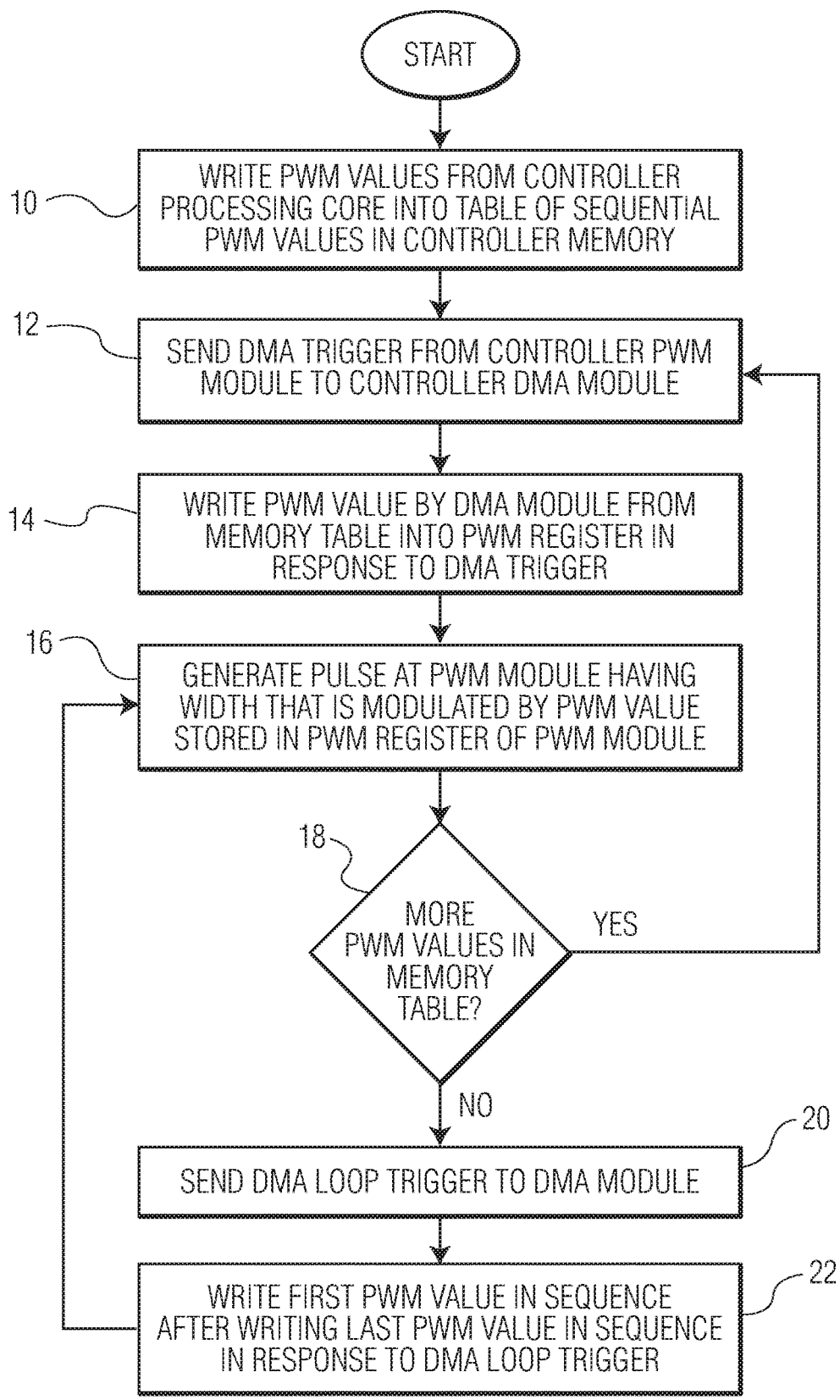
FIG. 10 is a process flow diagram of an example of generating a variable duty cycle PWM pulse sequence.

FIG. 10 is a process flow diagram of operations performed by the controller to generate a variable duty cycle PWM pulse sequence as described above. At 10, PWM values are written from the controller processing core into the table of sequential PWM values in the controller memory. These values are determined by the processing core, modified by the processing core, or preconfigured for later use in the field. At 12, a DMA trigger is sent from the PWM module to the DMA module. This trigger may be the initial start trigger, shown as DMA Trigger #0. Alternatively, it may be another later trigger. At 14, the PWM value that is next in order in the table is written by the DMA module from the memory table into the PWM register in response to the DMA trigger.

At 16, a pulse is generated at the PWM module having a width that is modulated by the PWM value stored in the PWM register. In some embodiments, the PWM values represent timing so that the value directly indicates the selected pulse width. The PWM applies these timing values to generate a pulse of the respective width. At 18, the DMA module determines whether there are more PWM values in the memory table. Is so then the process returns to 12. Another DMA trigger is received, another PWM value is written to the PWM module and another pulse is generated.

If the DMA module has reached the last PWM value in the table, then the process goes to 20. At 20, the DMA channel of the controller has come to the last value in order in the memory table and so the DMA channel of the controller sends the DMA loop trigger to the DMA module. In this way, the DMA loops back to the first table value without any need for core intervention. In some embodiments, the DMA is not able to loop back and the core sends the DMA loop trigger. At 22, the DMA module returns to the first value in the sequence of PWM values and writes that PWM value into the PWM register in response to the DMA trigger. After this, the process goes to 16 at which another pulse is generated now using the first value in the table.

The method of FIG. 10 may be described as operations that are repeated for each pulse. These operations together generate a sequence of variable duty cycle pulse width modulation (PWM) pulses. The operations all interrelate and include, first, writing PWM values from a processing core of a controller into a table of PWM values in a memory of the controller. Second, a sequence of pulses is generated at a PWM module of the controller. Each pulse has a width that is modulated by a PWM value stored in a PWM register of the PWM module. Third, a DMA trigger is sent from the PWM module to a direct memory access (DMA) module of the controller after generating each pulse. Fourth, a PWM value is written by the DMA module from the memory table into the PWM register in response to each DMA trigger. While the operations are identified as first, second, third and fourth, this for explanation and does not indicate a specific chronological sequence.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A controller comprising:
    a pulse width modulation (PWM) module configured to generate a sequence of pulses each having a width that is modulated by a PWM value stored in a register of the PWM module;
    a memory having a table of PWM values configured to be written into the PWM module register;
    a direct memory access (DMA) module coupled to the PWM module and to the memory table and configured to write a PWM value from the memory table into the PWM register in response to a DMA trigger; and
    a core coupled to the DMA module and configured to write the PWM values into the memory table.

2. The controller of claim 1, wherein the PWM module is configured to send the DMA trigger to the DMA module after generating each pulse.

3. The controller of claim 2, wherein the memory table has a sequentially ordered plurality of PWM values, and wherein the DMA module is configured to write the PWM values from the memory table into the PWM register in the sequential order in response to each DMA trigger.

4. The controller of claim 3, wherein the DMA module is configured to write the first PWM value in the sequence after writing the last PWM value in the sequence.

5. The controller of claim 1, wherein the PWM module is configured to generate at least two different sequences of pulses to drive two inputs of a power converter, the PWM module having a first register for the first of the at least two sequences and a second register for the second of the at least two sequences, wherein the DMA module has a first channel for the first register and a second channel for the second register, and wherein the DMA module is configured to write from the first channel to the first register in response to a first channel trigger from the PWM module and to write from the second channel to the second register in response to the first channel trigger from the PWM module.

6. The controller of claim 1, further comprising an input signal interface coupled to the core configured to receive an input signal and wherein the core is configured to modify the PWM values of the table of PWM values in response to the input signal and to write the modified PWM values into the memory.

7. The controller of claim 6, wherein the core is configured to modify the PWM values by selecting a stored set of different PWM values in response to the input signal.

8. The controller of claim 6, wherein the core is configured to modify the PWM values by incrementing and decrementing the PWM values in response to the input signal.

9. The controller of claim 6, wherein the input signal is a closed feedback loop from a power output of a power converter.

10. The controller of claim 6, wherein the input signal is a power output command from an external component.

11. A method for generating variable duty cycle pulse width modulation (PWM) pulses, the method comprising:
writing PWM values from a processing core of a controller into a table of PWM values in a memory of the controller;
generating a sequence of pulses at a PWM module of the controller, each pulse having a width that is modulated by a PWM value stored in a PWM register of the PWM module;
sending a DMA trigger from the PWM module to a direct memory access (DMA) module of the controller after generating each pulse; and
writing a PWM value by the DMA module from the memory table into the PWM register in response to each DMA trigger.

12. The method of claim 11, wherein the memory table has a sequentially ordered plurality of PWM values in a sequence, and wherein writing a PWM value comprises writing each PWM value from the table into the PWM register in the sequential order in response to each DMA trigger.

13. The method of claim 12, wherein writing a PWM value comprises writing the first PWM value in the sequence after writing the last PWM value in the sequence.

14. The method of claim 11, further comprising generating at least one additional sequence of pulses by the PWM module, the PWM module having a first register for the first of the at least two sequences and a second register for the second of the at least two sequences, wherein the DMA module has a first channel for the first register and a second channel for the second register, and wherein writing PWM values comprises writing from the first channel to the first register in response to a first channel trigger from the PWM module and writing from the second channel to the second register in response to a second channel trigger from the PWM module.

15. The method of claim 11, further comprising an input signal interface coupled to the processing core configured to receive an input signal, the method further comprising modifying the PWM values of the table of PWM values in response to the input signal and writing the modified PWM values into the memory.

16. The method of claim 15, wherein modifying the PWM value comprises selecting a stored set of different PWM values in response to the input signal.

17. The method of claim 11, further comprising applying the sequence of pulses to drive a power converter to produce a power output.

18. A charging system comprising:
a resonant circuit configured to apply a resonant field to charge a power storage device;
a power converter configured to receive a direct current power and a sequence of pulses and produce an alternating power output to drive the resonant circuit;
a pulse width modulation (PWM) module configured to generate the sequence of pulses each having a width that is modulated by a PWM value stored in a register of the PWM module;
a memory having a table of PWM values configured to be written into the PWM module register;
a direct memory access (DMA) module configured to write a PWM value from the memory into the PWM register in response to a DMA trigger from the PWM module; and
a processing core configured to write the PWM values into the memory.

19. The system of claim 18, further comprising an input signal interface coupled to the processing core configured to receive an input signal via a closed feedback loop from a power output of the power converter and wherein the processing core is configured to modify the PWM values of the memory table in response to the input signal and to write the modified PWM values into the memory table.

20. The system of claim 18, wherein the power converter has at least two inputs to receive two different sequences of pulses, wherein the PWM module is configured to generate the at least two different sequences of pulses to drive the two inputs of the power converter, the PWM module having a first register for the first sequence and a second register for the second sequence, wherein the DMA module has a first channel for the first register and a second channel for the second register, and wherein the DMA module is configured to write from the first channel to the first register in response to a first channel trigger from the PWM module and to write from the second channel to the second register in response to a second channel trigger from the PWM module.

* * * * *